(12) United States Patent
Ema et al.

(10) Patent No.: US 6,730,574 B2
(45) Date of Patent: May 4, 2004

(54) SEMICONDUCTOR DEVICE AND METHOD FOR FABRICATING THE SAME

(75) Inventors: Taiji Ema, Kawasaki (JP); Tohru Anezaki, Kawasaki (JP); Junichi Mitani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 171 days.

(21) Appl. No.: 09/975,510

(22) Filed: Oct. 12, 2001

(65) Prior Publication Data

US 2002/0024077 A1 Feb. 28, 2002

Related U.S. Application Data

(60) Division of application No. 08/928,770, filed on Sep. 12, 1997, now Pat. No. 6,335,552, which is a continuation-in-part of application No. 08/592,481, filed on Jan. 26, 1996, now Pat. No. 5,874,756.

(30) Foreign Application Priority Data

| Jan. 31, 1995 | (JP) | ................................................ 7-13748 |
| Nov. 29, 1995 | (JP) | ............................................. 7-310737 |
| Sep. 13, 1996 | (JP) | ............................................. 8-243687 |

(51) Int. Cl.[7] .................... H01L 21/20; H01L 21/8242
(52) U.S. Cl. .................. 438/386; 438/255; 438/239; 438/397; 438/399
(58) Field of Search ................................. 438/255, 398, 438/253, 396, 254, 397, 238, 239, 256, 399, 386

(56) References Cited

U.S. PATENT DOCUMENTS

| 5,012,310 A |   | 4/1991  | Kimura et al. ............. 357/23.6 |
| 5,185,689 A |   | 2/1993  | Maniar ........................ 361/313 |
| 5,293,510 A |   | 3/1994  | Takenaka ..................... 257/295 |
| 5,315,141 A |   | 5/1994  | Kim ........................ 257/308 |
| 5,330,928 A | * | 7/1994  | Tseng ........................ 438/254 |
| 5,561,307 A |   | 10/1996 | Mihara et al. ............. 257/295 |
| 5,900,660 A | * | 5/1999  | Jost et al. .................... 257/306 |
| 6,010,941 A | * | 1/2000  | Fischer et al. .............. 438/396 |
| 6,043,119 A | * | 3/2000  | Wu et al. .................... 438/254 |
| 6,064,084 A | * | 5/2000  | Tanahashi ................... 257/296 |

* cited by examiner

*Primary Examiner*—Matthew Smith
*Assistant Examiner*—Chuong A Luu
(74) *Attorney, Agent, or Firm*—Armstrong, Kratz, Quintos, Hanson & Brooks, LLP

(57) ABSTRACT

The semiconductor device includes a MOSFET including a pair of impurity diffused regions formed on both sides of a gate formed on a semiconductor substrate; an insulation film covering a top of the MOSFET and having a through-hole opened on one of the impurity diffused regions formed in; and a capacitor formed at at least a part of an inside of the through-hole, the through-hole having a larger diameter inside than at a surface thereof or having a larger diameter at an intermediate part between the surface thereof and a bottom thereof than the surface and the bottom thereof.

17 Claims, 4 Drawing Sheets

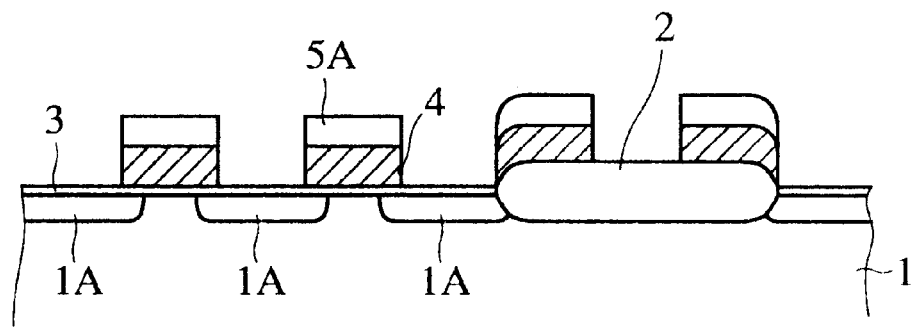
FIG. 2A
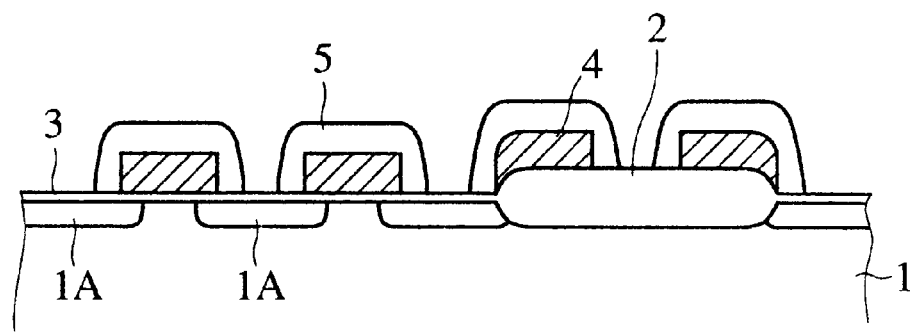
FIG. 2B
FIG. 2C
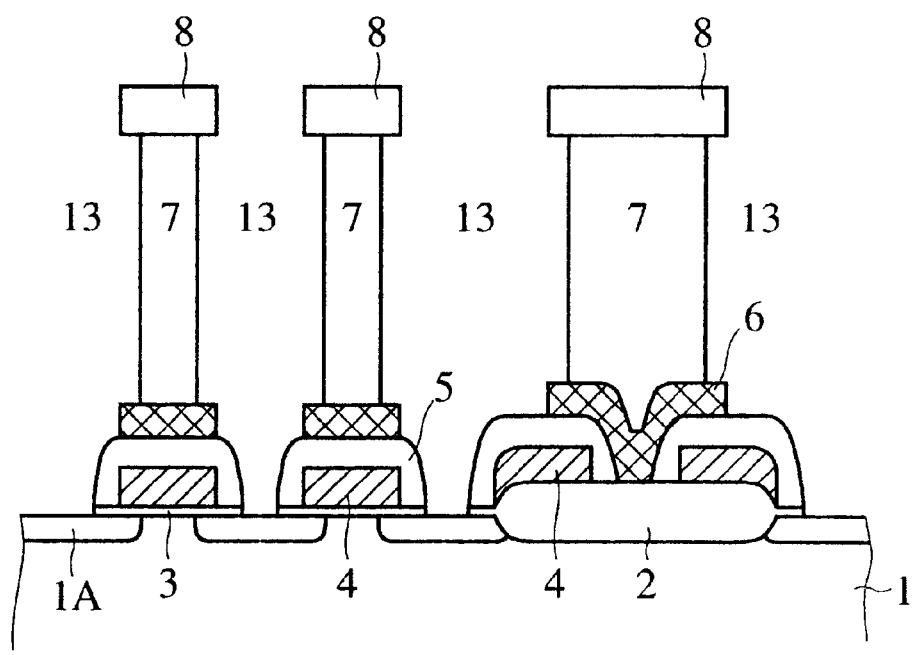

SEMICONDUCTOR DEVICE AND METHOD FOR FABRICATING THE SAME

CROSS REFERENCE TO RELATED APPLICATION

This application is a divisional of prior application Ser. No. 08/928,770, filed Sep. 12, 1997, with a Patent number U.S. Pat. No. 6,335,552, which is a CIP of 08/592,481, filed Jan. 26, 1996, with a Patent number U.S. Pat. No. 5,874,756.

BACKGROUND OF THE INVENTION

The present invention relates to a semiconductor device and a method for fabricating the same, more specifically to a high-integration DRAM and a method for fabricating the same.

The present invention can realize a large capacitor and a micronized memory while securing an alignment allowance in a lithography step and electric isolation.

With reference to FIGS. 3A and 3B, a conventional semiconductor device and a method for fabricating the same will be explained.

A field oxide film 2 for defining a device region is formed on a semiconductor substrate 1. A gate 4 of memory cell transistor is formed through a gate oxide film 3 in the device region defined by the field oxide film 2. A part of the gate 4 is extended on the field oxide film 2. An insulation film 5 is formed on the side walls and the upper surface of the gate 4. A silicon nitride ($Si_3N_4$) film 6 which function as an etching stopper and an inter-layer insulation film 12 are formed on the semiconductor substrate 1 having memory cell transistor. A through-hole is formed through these films down to the semiconductor substrate 1. A storage electrode 9 of a capacitor connected to the semiconductor substrate 1 is formed on the inside wall and the bottom of the through-hole. An opposed electrode 11 of the capacitor is formed through a dielectric film 10 on the surface of the storage electrode 9.

In the exemplified conventional semiconductor device, the side wall of the through-hole for the capacitor contact is vertical or tapered. In such capacitor, in a case that the through-hole has a large diameter for a larger capacitance, the opening is subjected to restrictions for an alignment allowance for a bit line contact and for electric isolation.

In a case that a hole diameter and a disalignment are large, as shown in FIG. 3A, the field oxide film 2 is adversely dug even though the contact is formed in self-alignment with the gate 4 to resultantly form a projection in the capacitor, with a resultant problem that an electric field tends to be concentrated to cause dielectric breakdown of the dielectric film 10. Increase of a hole diameter is restricted.

In a case that, as shown in FIG. 3B, the contact is formed only by an optical alignment, a hole diameter must be smaller because the storage electrode of the capacitor tends to short-circuit with the gate electrode.

Accordingly, in a case that the capacitor has such configuration, it is restricted to simply increase a hole diameter for a larger capacitance. As means for effectively omitting such restriction to the opening, the bit line contact is formed before, and then the capacitor is formed. A problem with this means is fabrication step increase.

SUMMARY OF THE INVENTION

An object of the present invention is to provide a larger capacitance while the requirements of alignment allowance for the alignment of an opening for a capacitor contact and a bit line contact, and of electric isolation from an adjacent conducting films.

The above-described object is achieved by a semiconductor device comprising: a MOSFET including a pair of impurity diffused regions formed on both sides of a gate formed on a semiconductor substrate: an insulation film covering a top of the MOSFET, a through-hole opened on one of the impurity diffused regions being formed in the insulation film; and a capacitor formed at at least a part of an inside of the through-hole, the through-hole having a larger diameter inside than at a surface thereof.

The above-described object is also achieved by a semiconductor device comprising: a MOSFET including a pair of impurity diffused regions formed on both sides of a gate formed on a semiconductor substrate: an insulation film covering a top of the MOSFET, a through-hole opened on one of the impurity diffused regions being formed in the insulation film; and a capacitor formed at at least a part of an inside of the through-hole, the through-hole having a larger diameter at an intermediate part thereof between a surface thereof and a bottom thereof than at the surface and the bottom thereof.

The above-described object is also achieved by a method for fabricating a semiconductor device comprising: a MOSFET forming step of forming on a semiconductor substrate a MOSFET including a gate and a pair of impurity diffused regions on both sides of the gate; an insulation film forming step of forming an insulation film for covering the MOSFET; a through-hole forming step of forming in the insulation film a through-hole having a larger diameter inside than at a surface thereof, the through-hole being opened on one of the impurity diffused regions; and a capacitor forming step of forming a capacitor at at least a part of an inside of the through-hole.

The above-described object is also achieved by a method for fabricating a semiconductor device comprising: a MOSFET forming step of forming on a semiconductor substrate a MOSFET including a gate and a pair of impurity diffused regions on both sides of the gate; an insulation film forming step of forming an insulation film for covering the MOSFET; a through-hole forming step of forming in the insulation film a through-hole having a larger diameter at an intermediate part between a surface thereof and a bottom thereof than the surface and the bottom thereof, the through-hole being opened on one of the impurity diffused regions; and a capacitor forming step of forming a capacitor at at least a part of an inside of the through-hole.

The above-described object is also achieved by a method for fabricating a semiconductor device comprising: a MOSFET forming step of forming on a semiconductor substrate a MOSFET including a gate and a pair of impurity diffused regions on both sides of the gate; an insulation film forming step of forming a plurality of insulation films being laminated for covering the MOSFET; a through-hole forming step of forming in the insulation films a through-hole having a larger diameter inside than at a surface thereof, the through-hole being opened on one of the impurity diffused regions; and a capacitor forming step of forming a capacitor at at least a part of an inside of the through-hole.

In the above-described method for fabricating the semiconductor device, it is preferable that the insulation film forming step includes a step of forming a first insulation film, and a step of forming on the first insulation film a second insulation film having etching characteristics different from those of the first insulation film; and the through-hole forming step includes a step of forming in the first insulation film and the second insulation film the through-hole having substantially the same opening diameter, and a step of retreating the first insulation film inside the through-hole by the use of an etchant having a higher etching rate with respect to the first insulation film than with respect to the second insulation film.

The above-described object is also achieved by a method for fabricating a semiconductor device comprising: a MOSFET forming step of forming on a semiconductor substrate a MOSFET including a gate and a pair of impurity diffused regions on both sides of the gate; an insulation film forming step of forming a plurality of insulation films being laminated for covering the MOSFET; a through-hole forming step of forming in the insulation films a through-hole having a larger diameter at an intermediate part between a surface thereof and a bottom thereof than the surface and the bottom thereof, the through-hole being opened on one of the impurity diffused regions; and a capacitor forming step of forming a capacitor at at least a part of an inside of the through-hole.

In the above-described method for fabricating the semiconductor device, it is preferable that the insulation film forming step includes a step of forming a first insulation film, a step of forming on the first insulation film a second insulation film having etching characteristics different from those of the first insulation film, and a step of forming on the second insulation film a third insulation film having etching characteristics different from those of the second insulation film; and the through-hole forming step includes a step of forming in the first insulation film, the second insulation film and the third insulation film the through-hole having substantially the same opening diameter, and a step of retreating the second insulation film inside the through-holes by the use of an etchant having a higher etching rate with respect to the second insulation film than with respect to the first and the third insulation film.

In the above-described method for fabricating the semiconductor device, it is preferable that the insulation film forming step includes a step of forming a first insulation film, a step of forming on the first insulation film a second insulation film having etching characteristics different from those of the first insulation film, and a step of forming on the second insulation film a third insulation film having etching characteristics different from those of the second insulation film; and the through-hole forming step includes a step of etching the second and the third insulation films by the use of an etchant which has a higher etching rate with respect to the second insulation film than with respect to the third insulation film and substantially anisotropically contains an isotropic component, and a step of isotropically etching the first insulation film by the use of an etchant having a higher etching rate with respect to the first insulation film than with respect to the second insulation film.

In the above-described method for fabricating the semiconductor device, it is preferable that the etchant for etching the first insulation film has a higher etching rate with respect to the second insulation film than with respect to the third insulation film.

In the above-described method for fabricating the semiconductor device, it is preferable that the first insulation film is a silicon nitride film; the second insulation film is a silicon oxide film containing boron and/or phosphorus: the third insulation film is a non-doped silicon oxide film.

BRIEF DESCRIPTION OF THE DRAWINGS

FIGS. 2A–2E are sectional views of the semiconductor device according to a first embodiment of the present invention in the steps of the method for fabricating the same, which explain the same and the method for fabricating the same.

DETAILED DESCRIPTION OF THE INVENTION

Figure 1A:
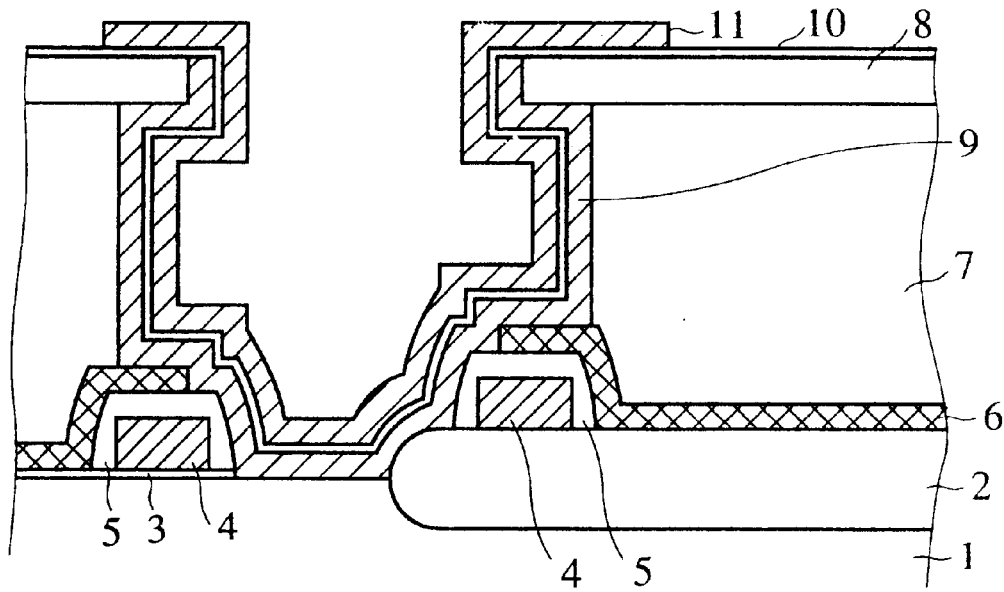
FIGS. 1A and 1B are diagrammatic sectional views of the semiconductor device, which explain the principle of the present invention.

The principle of the present invention will be explained with reference to FIGS. 1A and 1B.

A field oxide film 2 for defining a device region is formed on a semiconductor substrate 1. A gate 4 of a memory cell transistor is formed on a gate oxide film 3 in the device region defined by the field oxide film 2. A part of the gate 4 is extended on the field oxide film 2. An insulation film 5 is formed on the side wall and the upper surface of the gate 4. On the semiconductor substrate 1 with the memory cell transistor including the gate covered with the insulation film 5 are formed a silicon nitride ($Si_3N_4$) film 6 which is to function as an etching stopper, an inter-layer insulation film 7 of boro-phospho-silicate glass (BPSG) film, and inter-layer insulation film 8 of silicon dioxide ($SiO_2$) film are formed. A through-hole is formed through the silicon nitride film 6 and the inter-layer insulation films 7, 8. The through-hole has a larger diameter in the inter-layer insulation film 7 than in the silicon nitride film 6 and the inter-layer insulation film 8. A storage electrode 9 of a capacitor connected to the semiconductor substrate 1 is formed on the inside wall and the bottom of the through-hole. An opposed electrode 11 of the capacitor is formed on the surface of the storage electrode 9 through a dielectric film 10.

As described above, the present invention is characterized in that, as shown in FIG. 1A, the through-hole for the capacitor contact has a larger diameter at an intermediate part thereof between the opening (the surface) and the contact (the bottom) than at the opening and the contact thereof.

An inside diameter of the through-hole can be increased up to a size which permits electric isolation from the adjacent conducting film without considering an alignment allowance.

The through-hole is formed by forming the inter-layer insulation film of two or more insulation layers having etching rates different from each other, anisotropically etching the inter-layer insulation film, and isotropically etching the inter-layer insulation film by the use of an etching rate difference between insulation layers.

Figure 1B:
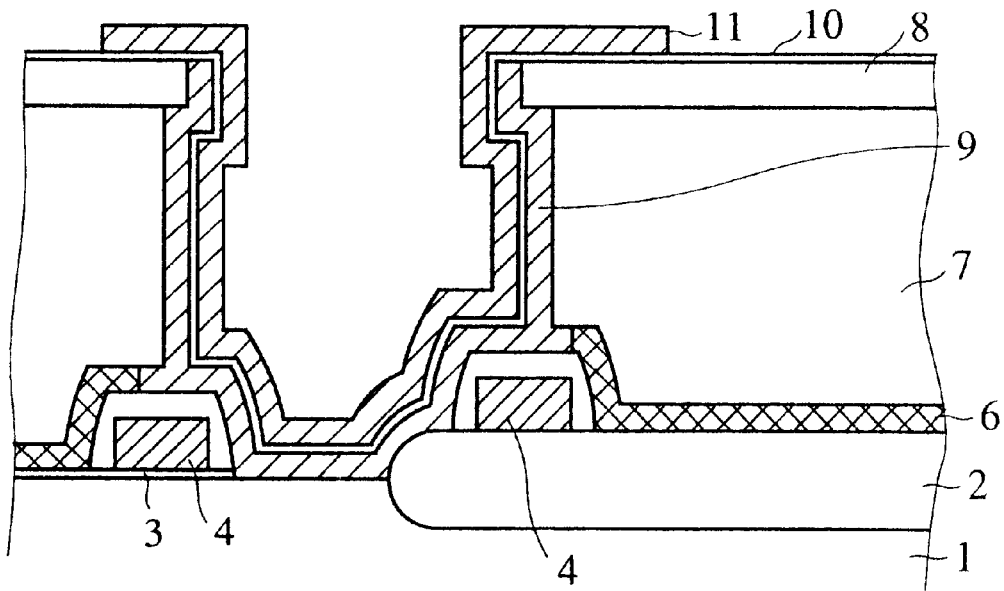

A configuration of the through-hole can be decided arbitrarily depending on a structure of the inter-layer insulation film, and can be as shown in FIG. 1B.

As described above, the capacitor can have an increased capacitance while the requirements of an alignment allowance for alignment of the opening and the contact of the capacitor contact, and electric isolation from the adjacent conducting film are met.

A First Embodiment

FIGS. 2A–2E are explanatory views of a first embodiment of the present invention.

As shown in FIG. 2A, a 200 nm-thick field oxide film 2 is formed on a p-type silicon (p-Si) substrate 1 by local oxidation method, and an about 7 nm-thick gate oxide film 3 is formed by thermal oxidation in an active region surrounded by the field oxide film 2.

Then, a 150 nm-thick polycrystalline silicon film 4 containing phosphorus is grown by chemical vapor deposition (CVD) method, and a 100 nm-thick $SiO_2$ film 5A is grown on the polycrystalline silicon film 4. Then, the polycrystalline silicon film 4 and the $SiO_2$ film 5A are patterned by lithography step and anisotropic etching to form a gate 4 of a MOSFET.

Then, with the gate 4 and the field oxide film 2 as a mask, a 1E14 $cm^{-2}$ dose of phosphorus ions ($P^+$) is implanted at a 20 keV energy to form a source/drain diffused layer 1A of the MOSFET.

As shown in FIG. 2B, a 100 nm-thick $SiO_2$ film is grown and is subjected to anisotropic etching to form a sidewall spacer 5.

As shown in FIG. 2C, a 100 nm-thick $Si_3N_4$ film 6 and a 2 $\mu$m-thick BPSG film 7 are grown by CVD method.

Then, the BPSG film 7 is reflowed by a thermal treatment for about 15 minutes in a 850° C. nitrogen atmosphere to planarize the surface of the substrate.

It is possible that a $SiO_2$ film may be provided below the $Si_3N_4$ film 6.

Then, a 200 nm-thick $SiO_2$ film 8 is grown by CVD method. The $SiO_2$ film 8 may function as a hard mask for forming a through-hole. A conducting film, e.g. a polycrystalline silicon film, may be also applicable for the hard mask, but in this case it should be noted that a capacitor and a bit line do not short-circuit with each other.

Then, a resist pattern for forming the through-hole is formed by photolithography step.

Then, the $SiO_2$ film 8 and the BPSG film 7 are etched with an etching gas (e.g., $C_4F_8+Ar+CO+O_2$) having an etching selectivity with respect to the $Si_3N_4$ film 6. Then, the $Si_3N_4$ film 6, which has functioned as the etching stopper is anisotropically etched to form the through-hole 13.

Then, the BPSG film 7 is selectively etched to be retreated by the use of a etching rate difference by isotopic etching, such as hydrofluoric acid treatment or others to form a larger-diameter portion in the through-hole. The larger-diameter portion may have a size which permits electric isolation from the adjacent conducting film.

The through-hole for exposing the source/drain diffused region 1A is extended on the gate 4. Unless the $Si_3N_4$ film 6 is etched under good control, a storage electrode to be formed in the through-hole and the gate 4 short-circuit with each other. This must be kept in mind.

Figure 3A:
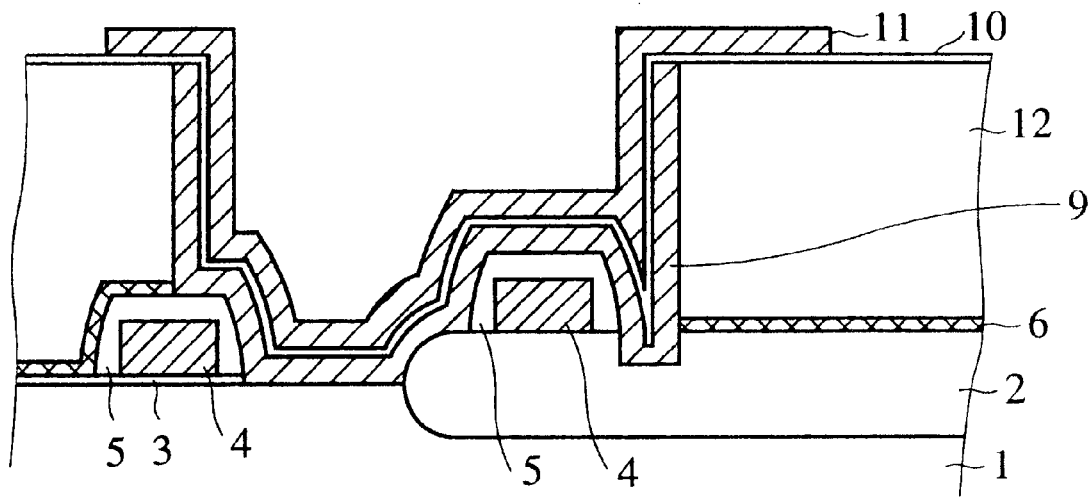
FIGS. 3A and 3B are sectional views of the conventional semiconductor device, which explain the problems of the conventional semiconductor device.
Figure 3B:
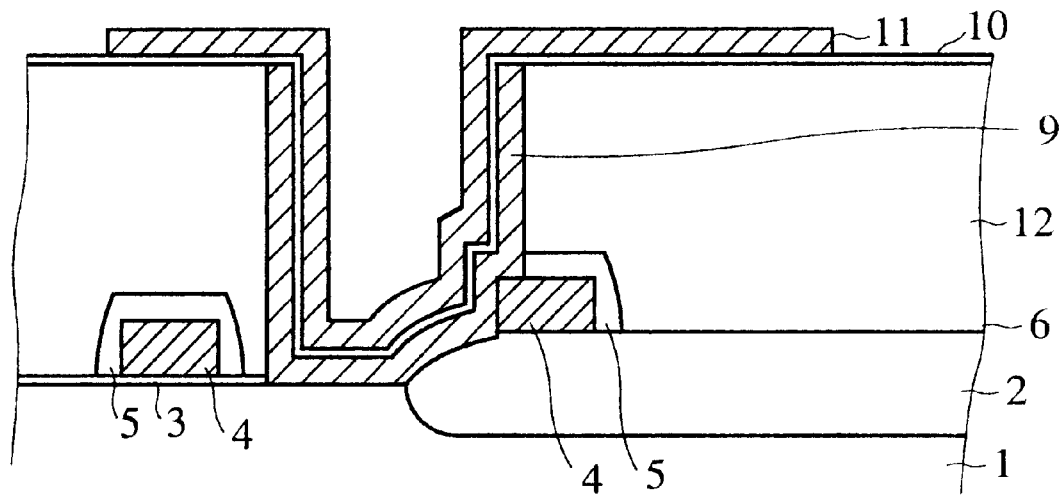

In a case that a contact diameter is large, or a disalignment in the photolithography is large, the through-hole is adversely extended even on the field oxide film. In etching the $Si_3N_4$ film 6, a projection of the capacitor in the field oxide film 2 as shown in FIG. 3A is formed, and dielectric breakdown of the dielectric film of the capacitor tends to occur due to electric field concentration. The projection must be avoided. A size of the contact is thus limited, and a contact diameter is generally determined by both an alignment allowance and the electric isolation.

Figure 2D:
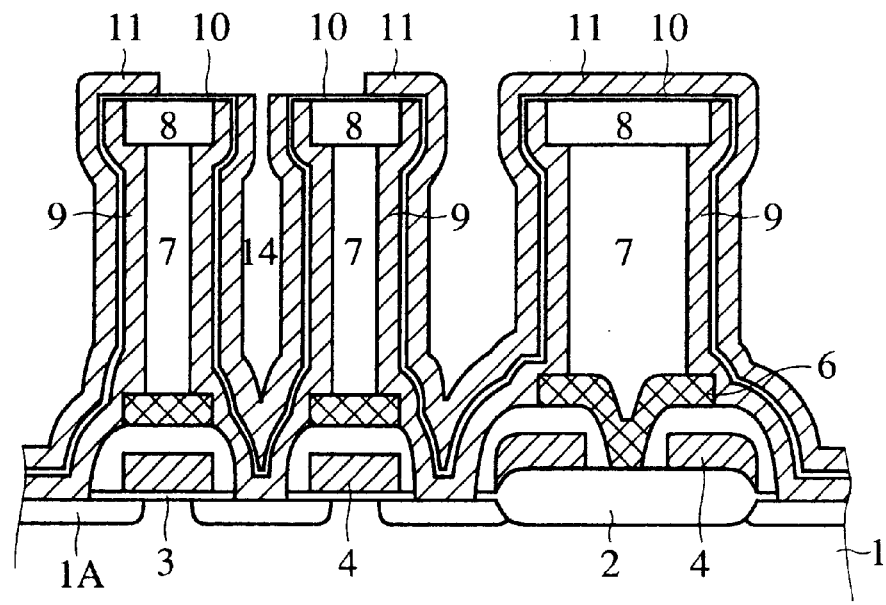

As shown in FIG. 2D, a 100 nm-thick polycrystalline silicon film containing phosphorus is grown by CVD method. The polycrystalline silicon film except that inside the through-holes 13 is removed by mechanical chemical polishing to form the storage electrodes 9 of the capacitors in respective through-holes 13. Reference numeral 14 is a lead portion for a bit line.

A 5 nm-thick $Si_3N_4$ film 10 is grown on the surface of the storage electrode 9 by CVD method. Then, the $Si_3N_4$ film 10 is oxidized to form the dielectric film 10 of a silicon oxynitride film. Then, a 100 nm-thick polycrystalline silicon film containing phosphorus is grown to form the opposed electrode 11 of the capacitor.

Then, the polycrystalline silicon film is etched by lithography step to form an opening 15 of the $Si_3N_4$ film of the lead portion of a bit line.

Figure 2E:
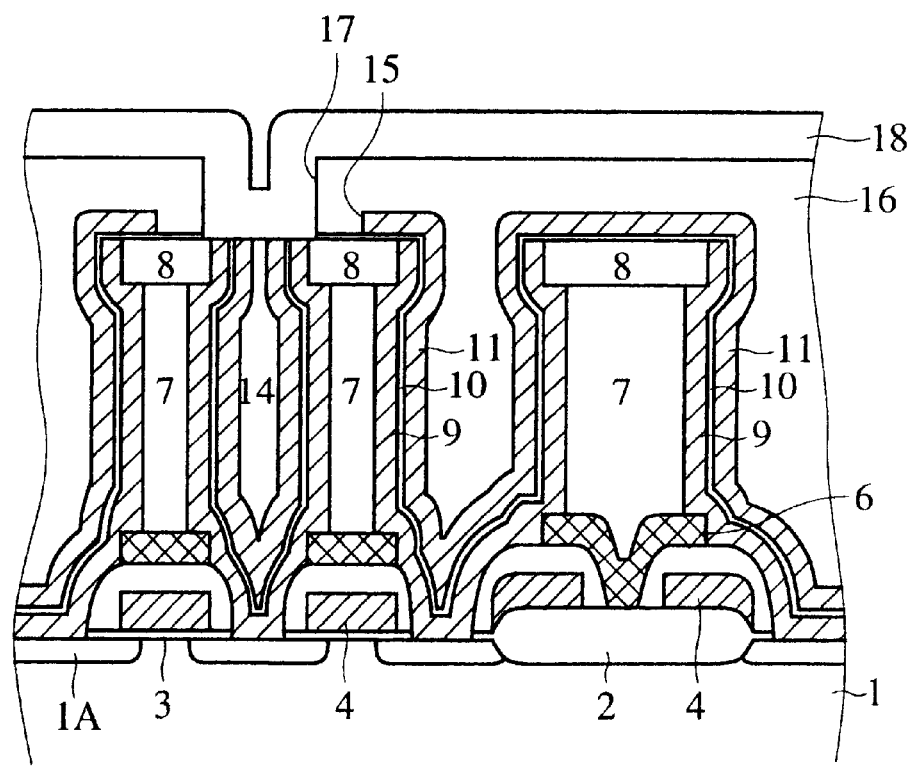

As shown in FIG. 2E, a 350 nm-thick BPSG film 16 is grown on the entire surface of the substrate by CVD method. Then, the BPSG film 16 is reflowed under the above-described conditions to planarize the surface of the substrate.

It is possible that an $SiO_2$ film is grown in place of the BPSG film and is planarized by mechanical chemical polishing.

Then, the BPSG film 16 is etched by lithography step to form an opening 17 in the BPSG film 16 in the lead portion for a bit line.

Although a portion of a larger-hole diameter is present inside the capacitor, the opening of the through-hole has the same diameter as the conventional opening, and an alignment allowance of the bit line contact is as conventional.

Then, Ti film, TiN film and W film are grown by CVD method in the stated order and patterned by lithography step to form a bit line 18.

Thus, hole diameters of the opening and the contact are defined in accordance with the requirements of an alignment allowance and electric isolation, but a through-hole whose inside diameter is determined by the requirement of electric isolation alone is formed, whereby the capacitor can easily have an increased capacitance with the conventional alignment allowance.

A Second Embodiment

The second embodiment is different from the first embodiment in the formation of the through-hole of the first embodiment shown in FIG. 2C.

As shown in FIG. 2C, a resist pattern for forming a through-hole is formed. Then, an $SiO_2$ film 8 and a BPSG film 7 are etched with an etching gas having a etching selectivity with respect to an $Si_3N_4$ film 6. Here the etching gas which has an etching rate having a relationship of $BPSG>SiO_2>Si_3N_4$, and is anisotropic and has a trace of an isotopic component, e.g., $C_4F_8+Ar+CO+O_2$, is used, whereby the BPSG film 7 is a little transversely extended. An extension depends on a film thickness of the BPSG film 7.

Then, the $Si_3N_4$ film 6 is isotopically etched to form a through-hole 13 for exposing a source/drain diffused region 1A of a MOSFET.

In a case that the $Si_3N_4$ film 6 is isotopically etched, an etching gas having an etching rate having a relationship of $Si_3N_4>BPSG>SiO_2$, e.g., $SF_6+HBr$, is used, and in a case that in etching the $SiO_2$ film 8 and the BPSG film 7, the BPSG film 7 is transversely much extended, the through-hole 13 has a configuration having a larger diameter inside as shown in FIG. 1A.

In a case that a transverse extension is small, the through-hole 13 has a reversely tapered configuration as shown in FIG. 1B. In this case, because the etching step of increasing an inside diameter also etches the $Si_3N_4$ film 6, no addition is made to a step number.

A Third Embodiment

In the first and the second embodiments, the capacitor and the lead portion for a bit line are concurrently formed, but the lead portion for a bit line may be opened after the capacitor is formed.

The contact of the capacitor is formed by self-alignment with the gate but may be formed by the usual alignment.

A Fourth Embodiment

In the first and the second embodiments, the capacitor and the lead portion for a bit line are concurrently opened, but the capacitor may be formed after the lead portion for a bit line is opened and the bit line is formed.

The contact of the capacitor is formed by self-alignment with the gate but may be formed by the usual alignment.

In forming the through-hole in the inter-layer insulation film by etching, the BPSG film on the $Si_3N_4$ film is anisotropically etched up to midway, then isotopically etched and again anisotropically etched to thereby form a larger-diameter in the through-hole. It is possible to further repeat the anisotropical etching and the isotopic etching to thereby form a plurality of a larger diameter. In this case, to define a diameter of the opening in the surface, the initial etching is anisotropic.

According to the present invention, the capacitor can have an increase capacitance while the requirements of an alignment allowance for alignment of the opening of the capacitor contact and the bit line contact and electric isolation from the adjacent conducting film.

What is claimed is:

1. A method for fabricating a semiconductor device comprising the steps of:
   forming on a semiconductor substrate a MOSFET including a gate and a pair of impurity diffused regions on both sides of the gate;
   forming an inter-layer insulation film for covering the MOSFET;
   forming in the inter-layer insulation film a through-hole having a diameter at an intermediate part between a surface thereof and a bottom thereof larger than a diameter at the surface, the through-hole being opened on one of the impurity diffused regions; and
   forming a capacitor at at least a part of an inside of the through-hole.

2. A method for fabricating a semiconductor device according to claim 1, wherein
   in the step of forming the through-hole, the through-hole having the diameter at the intermediate part larger than the diameter at the surface and a diameter at the bottom is formed.

3. A method for fabricating a semiconductor device according to claim 1, wherein
   in the step of forming the inter-layer insulation film, a plurality of insulation films are formed to form the inter-layer insulation film.

4. A method for fabricating a semiconductor device according to claim 3, wherein
   the step of forming the inter-layer insulation film includes a step of forming a first insulation film, and a step of forming on the first insulation film a second insulation film having an etching characteristic different from that of the first insulation film; and
   the step of forming the through-hole includes a step of forming in the first insulation film and the second insulation film the through-hole having substantially the same opening diameter, and a step of retreating the first insulation film inside the through-hole by the use of an etchant having a higher etching rate with respect to the first insulation film than with respect to the second insulation film.

5. A method for fabricating a semiconductor device according to claim 2, wherein
   in the step of forming the inter-layer insulation film, a plurality of insulation films are formed to form the inter-layer insulation film.

6. A method for fabricating a semiconductor device according to claim 5, wherein
   the step of forming the inter-layer insulation film includes a step of forming a first insulation film, a step of forming on the first insulation film a second insulation film having an etching characteristic different from that of the first insulation film, and a step of forming on the second insulation film a third insulation film having an etching characteristic different from that of the second insulation film; and
   the step of forming the through-hole includes a step of forming in the first insulation film, the second insulation film and the third insulation film the through-hole having substantially the same opening diameter, and a step of retreating the second insulation film inside the through-holes by the use of an etchant having a higher etching rate with respect to the second insulation film than with respect to the first and the third insulation film.

7. A method for fabricating a semiconductor device according to claim 5, wherein
   the step of forming the inter-layer insulation film includes a step of forming a first insulation film, a step of forming on the first insulation film a second insulation film having an etching characteristic different from that of the first insulation film, and a step of forming on the second insulation film a third insulation film having an etching characteristic different from that of the second insulation film; and
   the step of forming the through-hole includes a step of etching the second and the third insulation films by the use of an etchant which has a higher etching rate with respect to the second insulation film than with respect to the third insulation film and substantially anisotropically contains an isotropic component, and a step of isotropically etching the first insulation film by the use of an etchant having a higher etching rate with respect to the first insulation film than with respect to the second insulation film.

8. A method for fabricating a semiconductor device according to claim 7, wherein
   the etchant for etching the first insulation film has a higher etching rate with respect to the second insulation film than with respect to the third insulation film.

9. A method for fabricating a semiconductor device according to claim 7, wherein
   the first insulation film is a silicon nitride film;
   the second insulation film is a silicon oxide film containing boron and/or phosphorus:
   the third insulation film is a non-doped silicon oxide film.

10. A method for fabricating a semiconductor device according to claim 7, wherein
    the first insulation film is a silicon nitride film;
    the second insulation film is a silicon oxide film containing boron and/or phosphorus:
    the third insulation film is a non-doped silicon oxide film.

11. A method for fabricating a semiconductor device according to claim 1, wherein in the step of forming the through-hole, the through-hole having a diameter at the bottom larger than the diameter at the intermediate part is formed.

12. A method for fabricating a semiconductor device according to claim 11, wherein the step of forming the inter-layer insulation film includes a step of forming a first insulation film, a step of forming on the first insulation film a second insulation film having an etching characteristic different from that of the first insulation film, and a step of forming on the second insulation film a third insulation film having an etching characteristic different from that of the second insulation film; and the step of forming the through-hole includes a step of etching the second and the third insulation films by the use of an etchant which has a higher etching rate with respect to the second insulation film than with respect to the third insulation film and substantially anisotropically contains an isotropic component, and a step of isotropically etching the first insulation film by the use of an etchant having a higher etching rate with respect to the first insulation film than with respect to the second insulation film.

13. A method for fabricating a semiconductor device according to claim 12, wherein the etchant for etching the first insulation film has a higher etching rate with respect to the second insulation film than with respect to the third insulation film.

14. A method for fabricating a semiconductor device according to claim 6, wherein the step of forming the inter-layer insulation film further includes, before the step of forming the first insulation film, the step of forming a fourth insulation film.

15. A method for fabricating a semiconductor device according to claim 7, wherein the step of forming the inter-layer insulation film further includes, before the step of forming the first insulation film, the step of forming a fourth insulation film.

16. A method for fabricating a semiconductor device according to claim 12, wherein the step of forming the inter-layer insulation film further includes, before the step of forming the first insulation film, the step of forming a fourth insulation film.

17. A method for fabricating a semiconductor device according to claim 1, further comprising, after the step of forming the gate, the steps of forming a fifth insulation film above an upper surface and a side wall of the gate, in which in the step of forming the through-hole, the through-hole is formed in self-alignment with the gate by using the fifth insulation film as a stopper.

* * * * *

UNITED STATES PATENT AND TRADEMARK OFFICE
Certificate

Patent No. 6,730,574 B2

Patented: May 4, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Junichi Mitani, Kawasaki, Japan.

Signed and Sealed this Thirteenth Day of December 2005.

MATTHEW SMITH
*Supervisory Patent Examiner*
Art Unit 2825